United States Patent
Breil et al.

(10) Patent No.: US 9,293,554 B2
(45) Date of Patent: Mar. 22, 2016

(54) SELF-ALIGNED LINER FORMED ON METAL SEMICONDUCTOR ALLOY CONTACTS

(71) Applicant: GLOBALFOUNDRIES INC., Grand Cayman (KY)

(72) Inventors: Nicolas Breil, Grenoble (FR); Christian Lavoie, Ossining, NY (US); Ahmet S. Ozcan, Pleasantville, NY (US); Kathryn T. Schonenberg, Wappingers Falls, NY (US); Jian Yu, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/797,982

(22) Filed: Jul. 13, 2015

(65) Prior Publication Data

US 2015/0318371 A1  Nov. 5, 2015

Related U.S. Application Data

(62) Division of application No. 14/177,481, filed on Feb. 11, 2014, now Pat. No. 9,093,425.

(51) Int. Cl.
  *H01L 21/8238* (2006.01)
  *H01L 29/45* (2006.01)
  *H01L 29/66* (2006.01)
  *H01L 21/285* (2006.01)

(52) U.S. Cl.
  CPC .......... *H01L 29/456* (2013.01); *H01L 21/2855* (2013.01); *H01L 21/28518* (2013.01); *H01L 21/28568* (2013.01); *H01L 29/665* (2013.01)

(58) Field of Classification Search
  CPC ............... H01L 21/28518; H01L 21/8238; H01L 21/823814; H01L 27/092; H01L 29/49; H01L 29/4933; H01L 29/665; H01L 29/94
  See application file for complete search history.

(56) References Cited

U.S. PATENT DOCUMENTS

| | | |
|---|---|---|
| 6,063,681 A | 5/2000 | Son |
| 6,815,235 B1 | 11/2004 | Markle |
| 7,023,055 B2 | 4/2006 | Ieong et al. |
| 7,329,923 B2 | 2/2008 | Doris et al. |
| 7,737,032 B2 | 6/2010 | Chan et al. |
| 2005/0116290 A1 | 6/2005 | de Souza et al. |
| 2005/0239287 A1 | 10/2005 | Wang et al. |
| 2007/0284693 A1 | 12/2007 | Kim et al. |
| 2010/0155954 A1 | 6/2010 | Mukherjee et al. |
| 2011/0287318 A1 | 11/2011 | Loveness et al. |
| 2012/0112292 A1 | 5/2012 | Lavoie et al. |
| 2012/0175682 A1 | 7/2012 | Hagleitner et al. |
| 2013/0309830 A1* | 11/2013 | Guo ............. H01L 29/0847 438/285 |

* cited by examiner

*Primary Examiner* — Hoai V Pham
(74) *Attorney, Agent, or Firm* — Scully, Scott, Murphy & Presser, P.C.

(57) ABSTRACT

Metal semiconductor alloy contacts are provided on each of a source region and a drain region which are present in a semiconductor substrate. A transition metal is then deposited on each of the metal semiconductor alloy contacts, and during the deposition of the transition metal, the deposited transition metal reacts preferably, but not necessarily always, in-situ with a portion of each the metal semiconductor alloy contacts forming a transition metal-metal semiconductor alloy liner atop each metal semiconductor alloy contact. Each transition metal-metal semiconductor alloy liner that is provided has outer edges that are vertically coincident with outer edges of each metal semiconductor alloy contact. The transition metal-metal semiconductor alloy liner is more etch resistant as compared to the underlying metal semiconductor alloy. As such, the transition metal-metal semiconductor alloy liner can serve as an effective etch stop layer during any subsequently performed etch process.

11 Claims, 12 Drawing Sheets

US 9,293,554 B2

SELF-ALIGNED LINER FORMED ON METAL SEMICONDUCTOR ALLOY CONTACTS

This is a divisional of application Ser. No. 14/177,481 filed Feb. 11, 1998, now U.S. Pat. No. 9,093,425.

BACKGROUND

The present application relates to semiconductor structures and methods of forming the same. More particularly, the present application relates to semiconductor structures including a stack of, from bottom to top, a metal semiconductor alloy portion and a transition metal-metal semiconductor alloy portion located on each side of a functional gate structure. The present application also provides methods for forming such semiconductor structures.

Field effect transistors (FETs) are the basic building block of today's integrated circuits. Such transistors can be formed in conventional bulk substrates (such as silicon) or in semiconductor-on-insulator (SOI) substrates.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process. High temperature anneals can be performed to activate the junctions after which the source/drain and top portion of the gate are generally converted into a metal semiconductor alloy (i.e., a metal silicide). The formation of the metal semiconductor alloy typically requires that a transition metal be deposited on the semiconductor substrate followed by a process to produce the metal semiconductor alloy. Such a process forms low resistivity metal semiconductor alloy contacts to the deep source/drain regions.

In current technologies, and among other limiting factors, the metal semiconductor alloy containing contacts can be affected by the following two defects: (1) Encroachment of the metal semiconductor alloy which typically increases leakage through the source/drain junction and can also completely short the source region and the drain region of the device. (2) Spotty (non-uniform) metal semiconductor alloys which may cause unwanted etching of the metal semiconductor alloy contact during a subsequently performed etch.

These two defects are either formed during a subsequently performed etching process or the defects are enhanced by a subsequently performed etching process. Limiting these effects is critical for upcoming technologies.

SUMMARY

Metal semiconductor alloy contacts are provided on each of a source region and a drain region which are present in a semiconductor substrate. A transition metal is then deposited on each of the metal semiconductor alloy contacts, and during the deposition of the transition metal, the deposited transition metal reacts preferably, but not necessarily always, in-situ with a portion of each of the metal semiconductor alloy contacts forming a transition metal-metal semiconductor alloy liner atop each metal semiconductor alloy contact. Each transition metal-metal semiconductor alloy liner that is provided has outer edges that are vertically coincident, i.e., vertically aligned, with outer edges of each metal semiconductor alloy contact. The transition metal-metal semiconductor alloy liner is more etch resistant as compared to the underlying metal semiconductor alloy contact. As such, the transition metal-metal semiconductor alloy liner can serve as an effective etch stop layer during any subsequently performed etch process.

In one aspect of the present application, semiconductor structures are provided. The semiconductor structures of the present application include a semiconductor substrate having a source region and a drain region located within a semiconductor material portion of the semiconductor substrate, wherein the source region and the drain region are spaced apart by a channel region. The semiconductor structure also includes a functional gate structure located above the channel region, a source-side material stack of, from bottom to top, a source-side metal semiconductor alloy portion and a source-side transition metal-metal semiconductor alloy portion located on one side of the functional gate structure and located atop the source region, and a drain-side material stack of, from bottom to top, a drain-side metal semiconductor alloy portion and a drain-side transition metal-metal semiconductor alloy portion located on another side of the functional gate structure and located atop the drain region.

In another aspect of the present application, methods of forming semiconductor structures are provided. In one embodiment, the method includes providing a source region and a drain region at a footprint of a functional gate structure. Next a source-side metal semiconductor alloy portion is formed on the source region, and a drain-side metal semiconductor alloy portion is formed on the drain region. A transition metal is then deposited on at least the source-side metal semiconductor alloy portion and the drain-side metal semiconductor alloy portion, wherein during the depositing the transition metal reacts preferably in-situ with the source-side metal semiconductor alloy portion forming a source-side transition metal-metal semiconductor alloy portion on a surface of the source-side metal semiconductor alloy portion, and the transition metal reacts preferably in-situ with the drain-side metal semiconductor alloy portion forming a drain-side transition metal-metal semiconductor alloy portion on a surface of the drain-side metal semiconductor alloy portion. Next, remaining portions of the transition metal are removed.

In another embodiment, the method includes providing a source region and a drain region at a footprint of a sacrificial gate structure. Next, a source-side metal semiconductor alloy portion is formed on the source region, and a drain-side metal semiconductor alloy portion is formed on the drain region. A transition metal is then deposited on at least the source-side metal semiconductor alloy portion and the drain-side metal semiconductor alloy portion, wherein during the depositing the transition metal reacts preferably in-situ with the source-side metal semiconductor alloy portion forming a source-side transition metal-metal semiconductor alloy portion on a surface of the source-side metal semiconductor alloy portion, and the transition metal reacts preferably in-situ with the drain-side metal semiconductor alloy portion forming a drain-side transition metal-metal semiconductor alloy portion on a surface of the drain-side metal semiconductor alloy portion. Next, remaining portions of the transition metal are removed. In accordance with the present application, the sacrificial gate structure can be replaced with a functional gate structure prior to forming the source-side metal semiconductor alloy portion on the source region, and the drain-side metal semiconductor alloy portion on the drain region, or after removing the transition metal.

DETAILED DESCRIPTION

Figure 1:
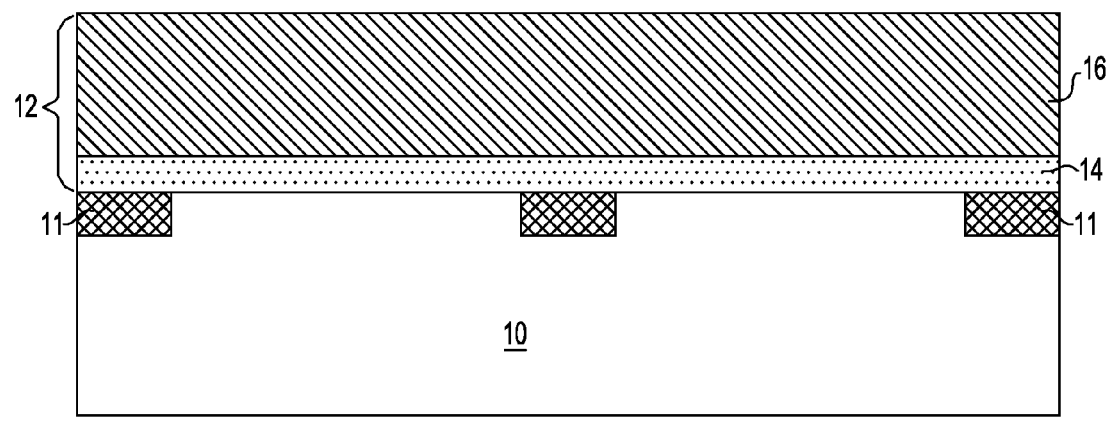
FIG. 1 is a cross sectional view of a first exemplary semiconductor structure including a material stack located on an upper surface of semiconductor substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application can begin by first providing metal semiconductor alloy contacts on each of a source region and a drain region which are present in a semiconductor substrate. A transition metal can then deposited atop each of the metal semiconductor alloy contacts. During the deposition of the transition metal, the deposited transition metal reacts preferably, but necessarily always, in-situ with a portion of each of the metal semiconductor alloy contacts forming a transition metal-metal semiconductor alloy liner atop each metal semiconductor alloy contact. An optional anneal can be used to thicken the previously formed transition metal-metal semiconductor alloy liner. The transition metal-metal semiconductor alloy liner is more etch resistant as compared to the underlying metal semiconductor alloy contact. As such, the transition metal-metal semiconductor alloy liner can serve as an effective etch stop layer during any subsequently performed etch process. Some specific examples of the formation of the aforementioned transition metal-metal semiconductor alloy liner atop a metal semiconductor alloy contact are now provided.

Referring first to FIG. 1, there is illustrated a first exemplary semiconductor structure including a material stack 12 located on an upper surface of semiconductor substrate 10 in accordance with an embodiment of the present application. The material stack 12 includes, from bottom to top, a gate dielectric material 14 and a gate conductor 16.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an upper surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process, gas phase doping or epitaxial growth.

In some embodiments, the semiconductor substrate 10 can be processed to include at least one isolation region 11 therein. The at least one isolation region 11 can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region 11 may provide isolation between neighboring gate structures, typically required when the neighboring gate structures have opposite conductivities, i.e., n-type transistors and p-type transistors. As such, the at least one isolation region 11 can separate a first device region in which an n-type transistor device can be formed and second device region in which a p-type transistor device can be formed.

A material stack 12 is formed on an upper surface of the semiconductor substrate 10 and on an upper surface of each isolation region 11. As stated above, the material stack 12 includes, from bottom to top, a gate dielectric material 14 and a gate conductor 16. The gate dielectric material 14 and the gate conductor 16 which provide material stack 12 are formed as blanket layers atop the upper surface of the semiconductor substrate 10.

In this embodiment of the present application, the material stack 12 is used in providing a functional gate structure. The term "functional gate structure" is used throughout the present application as a permanent gate structure used to control output current (i.e., flow of carriers in the channel) of a semiconducting device through electrical or magnetic fields.

The gate dielectric material 14 that can be used in the present application can be a semiconductor oxide, a semiconductor nitride, and/or a semiconductor oxynitride. In one example, the gate dielectric material 14 can be composed of silicon dioxide, silicon nitride and/or silicon oxynitride. In another embodiment of the present application, the gate dielectric material 14 may include at least a dielectric metal oxide. Exemplary dielectric metal oxides that can be used as gate dielectric material 14 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material 14.

In some embodiments of the present application, the gate dielectric material 14 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material 14 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material 14 can have a thickness in a range from 1 nm to 10 nm. Other thicknesses that are lesser than or greater than the aforementioned thickness range can also be employed for the gate dielectric material 14.

The gate conductor 16 that can be used in the present application can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor 16 is comprised of a doped polysilicon or doped polysilicon germanium. In another embodiment, a lower portion of the gate conductor 16 is comprised a conductive material other than doped polysilicon or doped polysilicon germanium, and an upper portion of the gate conductor 16 is comprised of doped polysilicon or doped silicon germanium.

The gate conductor 16 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor 16 has a thickness from 1 nm to 100 nm. Other thicknesses that are lesser than or greater than the aforementioned thickness range can also be employed for the gate conductor 16.

Figure 2:
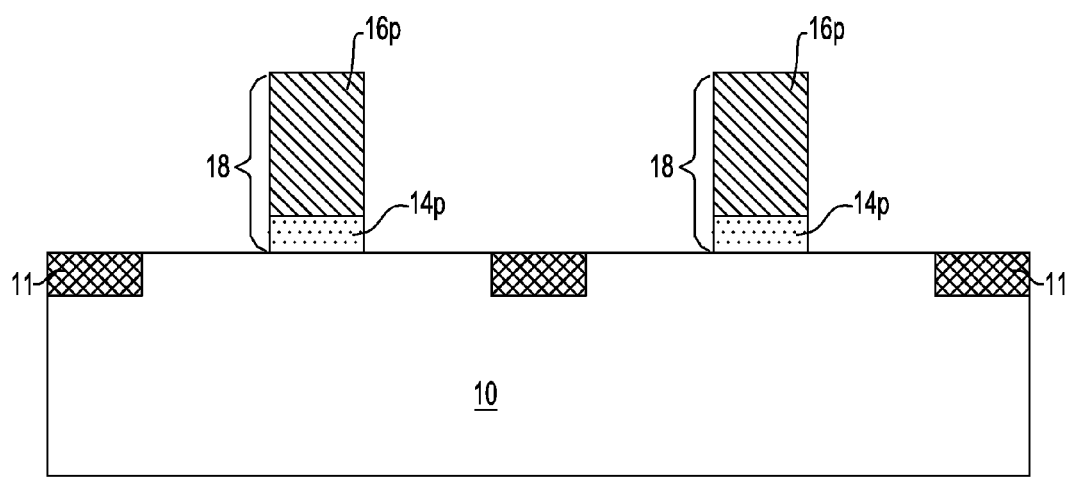
FIG. 2 is a cross sectional view of the first exemplary semiconductor structure of FIG. 1 after patterning the material stack into at least one functional gate structure.

Referring now to FIG. 2, there is illustrated the first exemplary semiconductor structure of FIG. 1 after patterning the material stack 12 (including gate dielectric material 14 and gate conductor 16) into at least one functional gate structure 18. The at least one functional gate structure 18 includes, from bottom to top, a gate dielectric portion 14p and a gate electrode portion 16p. Gate dielectric portion 14p includes a remaining portion of the gate dielectric material 14 of material stack 12, while gate conductor portion 16p includes a remaining portion of the gate conductor 16 of material stack 12.

The at least one functional gate structure 18 can be formed by lithography and etching. Lithography can include forming a photoresist (not shown) on the topmost surface of gate conductor 16 exposing the photoresist to a desired pattern of radiation, and then developing the exposed photoresist with a resist developer to provide a patterned photoresist atop the gate conductor 16 of material stack 12. At least one etch is then employed which transfers the pattern from the patterned photoresist into the various materials. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing.

As is shown in the embodiment illustrated in FIG. 2, the sidewall edges of the gate dielectric material portion 14p and the gate conductor 16p are vertically coincident to (i.e., vertically aligned with) each other.

Figure 3:
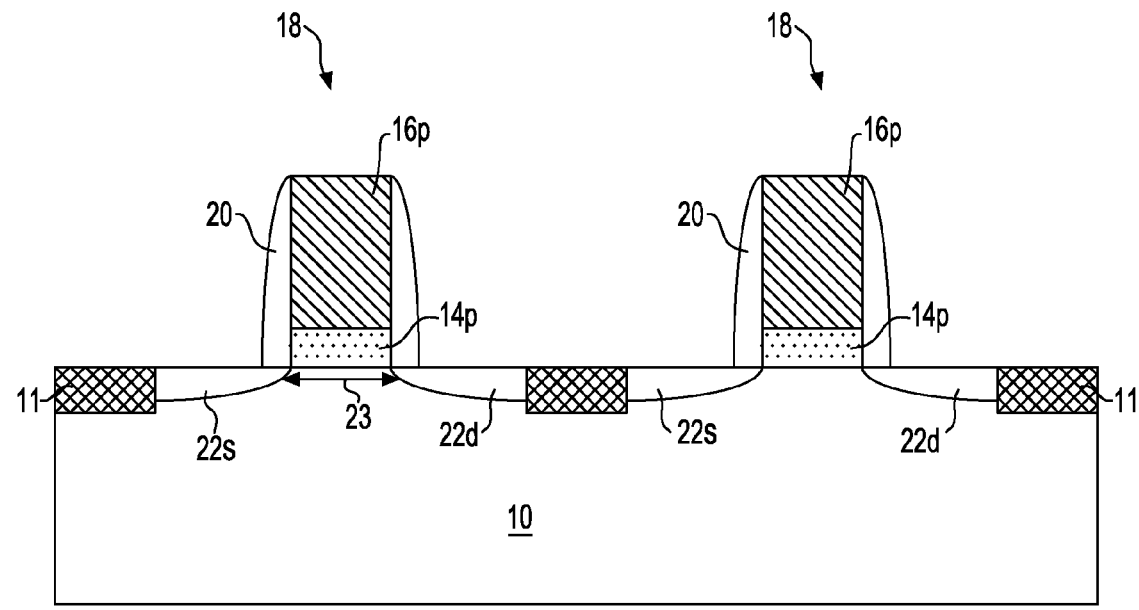
FIG. 3 is a cross sectional view of the first exemplary semiconductor structure of FIG. 2 after forming a spacer on each vertical sidewall of the at least one functional gate structure and forming a source region in a semiconductor material portion of the semiconductor substrate on one side of the at least one functional gate structure and forming a drain region in another semiconductor material portion of the semiconductor substrate on another side of the at least one functional gate structure.

Referring now to FIG. 3, there is illustrated the first exemplary semiconductor structure of FIG. 2 after forming a spacer 20 on each vertical sidewall of the at least one functional gate structure 18 and forming a source region 22s in a semiconductor material portion of the semiconductor substrate 10 on one side of the at least one functional gate structure 18 and forming a drain region 22d in another semiconductor material portion of the semiconductor substrate 10 on another side of the at least one functional gate structure 18. The semiconductor portion of the semiconductor substrate 10 that is located beneath the functional gate structure 18 and positioned between the source region 22s and the drain region 22d is referred as a channel region 23.

The spacer 20 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 20 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

FIG. 3 also shows the presence of a source region 22s located within a semiconductor material portion of the semiconductor substrate 10 on one side of the at least one functional gate structure 18 and a drain region 22d located within another semiconductor material portion of the semiconductor substrate 10 on another side of the at least one functional gate structure 18. In some embodiments, a source extension region and drain extension region (not separately shown) are typically formed prior to forming the spacer 20 utilizing an extension ion implantation process. As such, a portion of each of the source extension region and drain extension region would be located beneath the spacer 20. After forming the spacer 20, source region 22s and drain region 22d are formed utilizing a source/drain ion implantation process. An activation anneal may follow the implantation processes.

The source region 22s (including the corresponding source extension region) and the drain region (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate examples of n-type dopants, i.e., impurities, include, but are not limited to, antimony, arsenic and phosphorous. The concentration of dopants within the source region 22s (and corresponding source extension region) and the drain region 22d (and the corresponding drain extension region) can be within ranges typically used in forming metal oxide semiconductor field effect transistors (MOSFETs).

Figure 4:
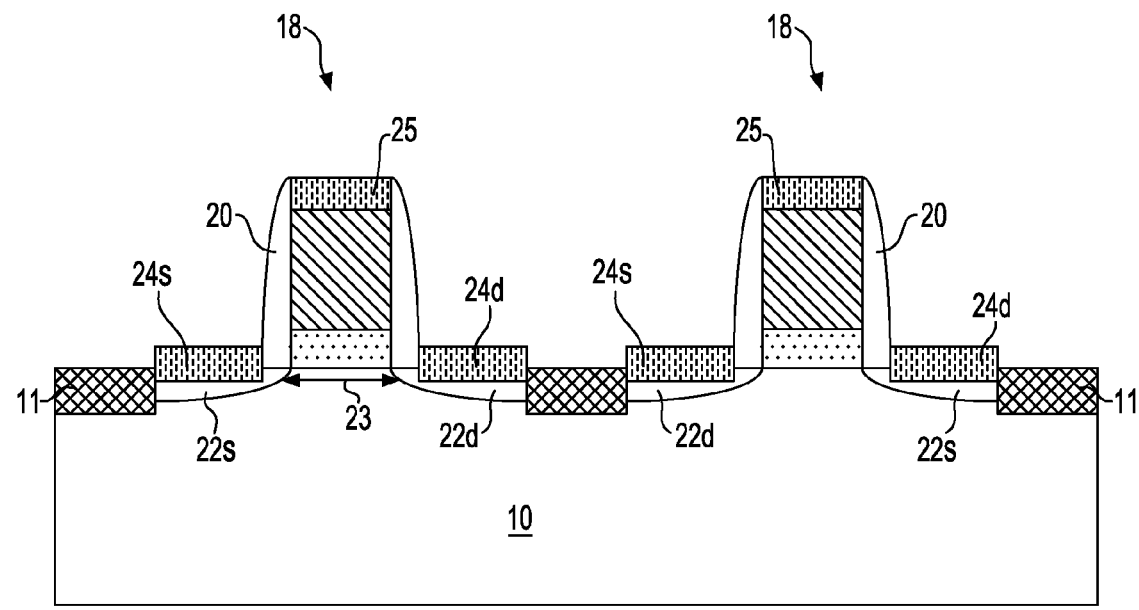
FIG. 4 is a cross sectional view of the first exemplary semiconductor structure of FIG. 3 after forming a source-side metal semiconductor alloy portion on the source region and a drain-side metal semiconductor alloy portion on the drain region.

Referring now to FIG. 4, there is illustrated the first exemplary semiconductor structure of FIG. 3 after forming a source-side metal semiconductor alloy portion 24s on the source region 22s and a drain-side metal semiconductor alloy portion 24d on the drain region 22d. The source-side metal semiconductor alloy portion 24s, and the drain-side metal semiconductor alloy portion 24d are comprised of a same metal semiconductor alloy.

In some embodiments such as shown in FIG. 4 and when a semiconductor material is present at an upper surface of the gate conductor portion 18p, a metal semiconductor alloy cap portion 25 can be formed on the gate conductor portion 18p.

In some embodiments, the source-side metal semiconductor alloy portion 24s, the drain-side metal semiconductor alloy portion 24d and optionally the metal semiconductor alloy cap portion 25 each include a same metal semiconductor alloy. In another embodiment, the source-side metal semiconductor alloy portion 24s, and the drain-side metal semiconductor alloy portion 24d each comprise a first metal semiconductor alloy, while the optional metal semiconductor alloy cap portion 25 comprises a second metal semiconductor alloy that is different from the first metal semiconductor alloy. The difference between the first metal semiconductor alloy and the second metal semiconductor alloy is in respect to the semiconductor element, not the metallic element that forms each metal semiconductor alloy.

The source-side metal semiconductor alloy portion 24s, the drain-side metal semiconductor alloy portion 24d and optionally the metal semiconductor alloy cap portion 25, are formed by first providing a layer of a metal semiconductor alloy forming metal (not shown) on all exposed surfaces of the structure shown in FIG. 3. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into the semiconductor material portions of the source region 22s, the drain region 22d and optionally the gate conductor portion 18p, forming a metal semiconductor alloy. Notably, the anneal can form the source-side metal semiconductor alloy portion 24s, the drain-side metal semiconductor alloy portion 24d and optionally the metal semiconductor alloy cap portion 25. In one embodiment, the source-side metal semiconductor alloy portion 24s, the drain-side metal semiconductor alloy portion 24d and optionally the metal semiconductor alloy cap portion 25 each comprise a metal silicide such as, for example, nickel silicide or platinum-nickel silicide. In another embodiment, the source-side metal semiconductor alloy portion 24s, the drain-side metal semiconductor alloy portion 24d and optionally the metal semiconductor alloy cap portion 25 each include a metal germanide such as nickel germanide.

The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

The above processing forms a source-side metal semiconductor alloy portion 24s that has outer edges that are vertically aligned with outer edges of the source region 22s, a drain-side metal semiconductor alloy portion 24d that has outer edges that are vertical aligned with outer edges of the drain region 22d, and an optional metal semiconductor alloy cap portion 25 that has outer edges that are vertically aligned with outer edges of a remaining portion of the gate conductor portion 16p. In some embodiments of the present application, the metal semiconductor alloy formation anneal may partially or entirely consume the semiconductor material portion of the source region 22s and the drain region 22d.

Figure 5:
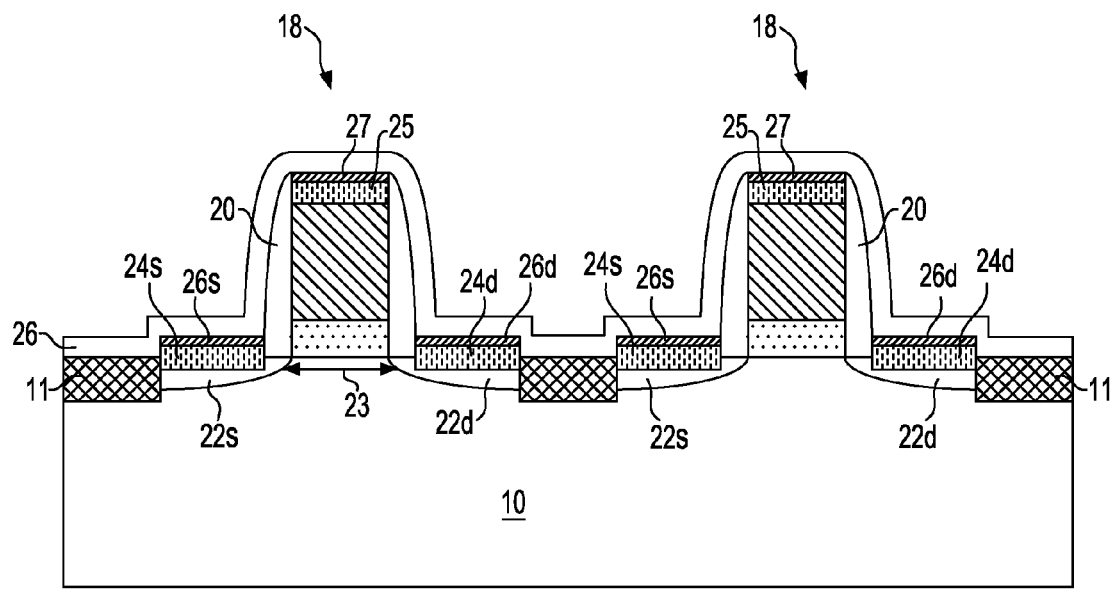
FIG. 5 is a cross sectional view of the first exemplary semiconductor structure of FIG. 4 after deposition of a transition metal in which a source-side transition metal-metal semiconductor alloy portion forms preferably in-situ on the source-side metal semiconductor alloy portion and a drain-side transition metal-metal semiconductor alloy portion forms preferably in-situ on the drain-side metal semiconductor alloy portion.

Referring now to FIG. 5, there is illustrated the first exemplary semiconductor structure of FIG. 4 after deposition of a transition metal 26 in which a source-side transition metal-metal semiconductor alloy portion 26s forms preferably in-situ on the source-side metal semiconductor alloy portion 24s and a drain-side transition metal-metal semiconductor alloy portion 26d forms preferably in-situ on the drain-side metal semiconductor alloy portion 24d. An optional transition metal-metal semiconductor alloy cap portion 27 can also be formed preferably in-situ on the metal semiconductor alloy cap portion 25. The source-side transition metal-metal semiconductor alloy portion 26s, the drain-side transition metal-metal semiconductor alloy portion 26d, and optionally the transition metal-metal semiconductor alloy cap portion 27 are formed simultaneously with the deposition of transition metal 26 by diffusion and intermixing of the transition metal with the underlying source-side metal semiconductor alloy portion 24s, drain-side metal semiconductor alloy portion 24d, and metal semiconductor alloy cap portion 25, respectively.

The transition metal 26 that provides the source-side transition metal-metal semiconductor alloy portion 26s, the drain-side transition metal-metal semiconductor alloy 26d, and optionally the transition metal-metal semiconductor alloy cap portion 27 comprises any transition metal that can diffuse and interact with the underlying source-side metal semiconductor alloy portion 24s, the drain-side metal semiconductor alloy portion 24d and, optionally, the metal-metal semiconductor alloy cap portion 25, with the proviso that the transition metal 26 is different from the metal semiconductor alloy forming metal mentioned above. Examples of transition metals that may be employed at this point of the present application include transition metals from Groups 4, 5 and 6 of the Periodic Table such as, for example, titanium (Ti), zirconium (Zr), hafnium (Hf), tantalum (Ta), tungsten (W), niobium (Nb), molybdenum (Mo), vanadium (V), and chromium (Cr). Rhenium (Re) can also be used as the transition metal 26. In some embodiments in which nFETs and pFETs are formed, different compositions of transition metals can be used in forming the source-side transition metal-metal semiconductor alloy portion 26s and the drain-side transition metal-metal semiconductor alloy portion 26d.

The transition metal 26 that provides the source-side transition metal-metal semiconductor alloy portion 26s, the drain-side transition metal-metal semiconductor alloy portion 26d, and optionally the transition metal-metal semiconductor alloy cap portion 27 can be formed by any of the deposition processes mentioned above in forming the metal semiconductor alloy forming metal. In one example, the transition metal 26 that provides the source-side transition metal-metal semiconductor alloy portion 26s, the drain-side transition metal-metal semiconductor alloy portion 26d, and optionally the transition metal-metal semiconductor alloy cap portion 27 can be formed by sputtering. In one embodiment, the sputtering can be performed at a temperature from room temperature (i.e., 20° C.) up to, and including 500° C. The thickness of the transition metal 26 that provides the source-side transition metal-metal semiconductor alloy portion 26s, the drain-side transition metal-metal semiconductor alloy portion 26d, and optionally the transition metal-metal semiconductor alloy cap portion 27 can be from 2 nm to 10 nm. Other thicknesses can also be employed for the thickness of the transition metal 26 that provides the source-side transition metal-metal semiconductor alloy portion 26s, the drain-side transition metal-metal semiconductor alloy portion 26d, and optionally the transition metal-metal semiconductor alloy cap portion 27.

In accordance with the present application, the source-side transition metal-metal semiconductor alloy portion 26s is composed on an intermixed product of the transition metal 26 and the previously formed source-side metal semiconductor alloy portion 24s. Typically, the source-side transition metal-metal semiconductor alloy portion 26s can contain up to 70% of the transition metal 26. In one example, and when the transition metal 26 comprises titanium, and the source-side metal semiconductor alloy portion 24s comprises nickel silicide, then the source-side transition metal-metal semiconductor alloy portion 26s comprises titanium-nickel silicide. In some embodiments, the source-side transition metal-metal semiconductor alloy portion 26s may comprise titanium-platinum-nickel silicide. The source-side transition metal-metal semiconductor alloy portion 26s has outer edges that are vertically aligned with outer edges of the source-side metal semiconductor alloy portion 24s. In one embodiment, the source-side transition metal-metal semiconductor alloy portion 26s has a first thickness from 1 nm to 10 nm. In another embodiment, the source-side transition metal-metal semiconductor alloy portion 26s has a first thickness from 1 nm to 3 nm.

In accordance with the present application, the drain-side transition metal-metal semiconductor alloy portion 26d is composed on an intermixed product of the transition metal 26 and the previously formed drain-side metal semiconductor alloy portion 24d. Typically, the drain-side transition metal-metal semiconductor alloy portion 26d can contain up to 70% of the transition metal 26. In one example, and when the transition metal 26 comprises titanium, and the drain-side metal semiconductor alloy portion 24d comprises nickel silicide, then the drain-side transition metal-metal semiconductor alloy portion 26d comprises titanium-nickel silicide. In some embodiments, the drain-side transition metal-metal semiconductor alloy portion 26d may comprise titanium-platinum-nickel silicide. The drain-side transition metal-metal semiconductor alloy portion 26d has outer edges that are vertically aligned with outer edges of the drain-side metal semiconductor alloy portion 24d. In one embodiment, the drain-side transition metal-metal semiconductor alloy portion 26d has a first thickness from 1 nm to 10 nm. In one embodiment, the drain-side transition metal-metal semiconductor alloy portion 26d has a first thickness from 1 nm to 3 nm. The source-side metal semiconductor-alloy portion 24s and the drain-side metal semiconductor alloy portion 24d that remain after forming source-side transition metal-metal semiconductor alloy portion 26s and the drain-side transition metal-metal semiconductor alloy portion 26d can have a thickness from 3 nm to 25 nm, with a thickness from 10 nm to 20 nm being more typical.

In accordance with the present application, the transition metal-metal semiconductor alloy cap portion 27 is composed on an intermixed product of the transition metal 26 and the previously formed metal semiconductor alloy cap portion 25. In one example, and when the transition metal 26 comprises titanium, and the metal semiconductor alloy cap portion 25 comprises nickel silicide, then the transition metal-metal semiconductor alloy cap portion 27 comprises titanium-nickel silicide. In some embodiments, transition metal-metal semiconductor alloy cap portion 27 may comprise titanium-platinum-nickel silicide. The transition metal-metal semiconductor alloy cap portion 27 has outer edges that are vertically aligned with outer edges of the metal semiconductor alloy cap portion 25. In one embodiment, the transition metal-metal semiconductor alloy cap portion 27 has a first thickness from 1 nm to 10 nm. In one embodiment, the transition metal-metal semiconductor alloy cap portion 27 has a first thickness from 1 nm to 3 nm.

The source-side transition metal-metal semiconductor alloy portion 26s, the drain-side transition metal-metal semiconductor alloy portion 26d, and optionally the transition metal-metal semiconductor alloy cap portion 27 have a higher etch resistance (in either a wet etch or a dry etch process) than the source-side metal semiconductor alloy portion 24s, the drain-side metal semiconductor alloy portion 24d, and optionally the metal semiconductor alloy cap portion 25.

It is noted that the remaining portions of the source-side metal semiconductor alloy portion 24s, the drain-side metal semiconductor alloy portion 24d, and optionally the metal semiconductor alloy cap portion 25 have a thickness that is less than the thickness of each of the source-side metal semiconductor alloy portion 24s, the drain-side metal semiconductor alloy portion 24d, and optionally the metal semiconductor alloy cap portion 25 prior to the formation of the source-side transition metal-metal semiconductor alloy portion 26s, the drain-side transition metal-metal semiconductor alloy portion 26d, and optionally the transition metal-metal semiconductor alloy cap portion 27.

Figure 6:
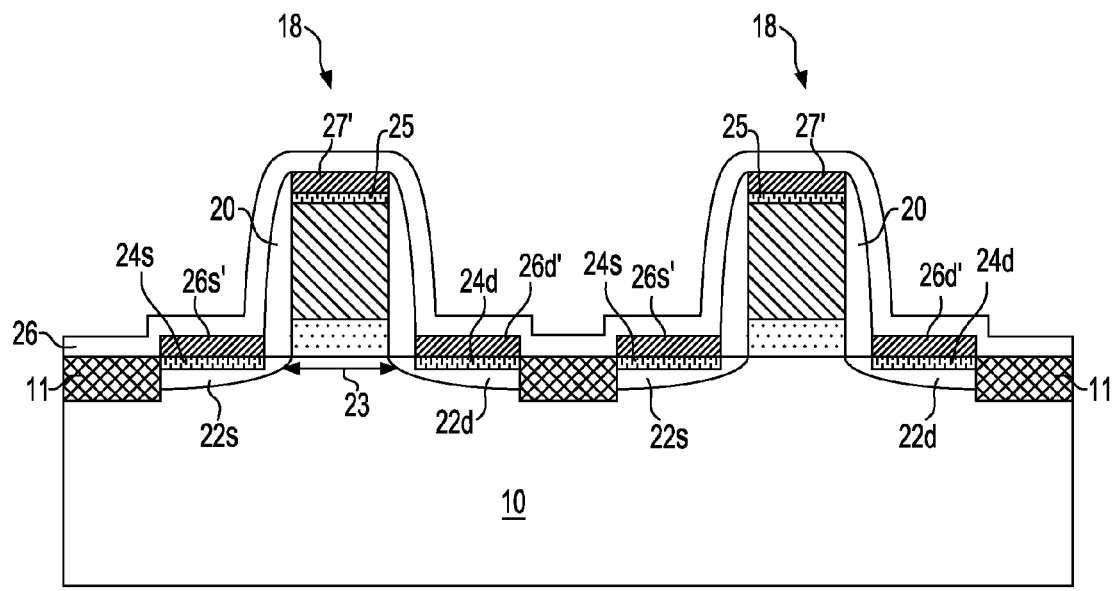
FIG. 6 is a cross sectional view of the first exemplary semiconductor structure of FIG. 5 after annealing.

Referring now to FIG. 6, there is illustrated the first exemplary semiconductor structure of FIG. 5 after annealing. This anneal step is optional and need not be performed in all instances. The anneal process serves to thicken the previously formed source-side transition metal-metal semiconductor alloy portion 26s, the drain-side transition metal-metal semiconductor alloy portion 26d, and optionally the transition metal-metal semiconductor alloy cap portion 27. The thickened source-side transition metal-metal semiconductor alloy portion is labeled as element 26s', the thickened drain-side transition metal-metal semiconductor alloy portion is labeled as 26d', and the optional thickened transition metal-metal semiconductor alloy cap portion is labeled as 27' in FIG. 6.

Notably, the anneal provides a thickened source-side transition metal-metal semiconductor alloy portion 26s' having a second thickness that is greater than the first thickness of the previously formed source-side transition metal-metal semiconductor alloy portion 26s, a thickened drain-side transition metal-metal semiconductor alloy portion 26d' having a second thickness that is greater than the first thickness of the previously formed drain-side transition metal-metal semiconductor alloy portion 26d, and, if present, the thickened transition metal-metal semiconductor alloy cap portion 27' has a second thickness that is greater than the previously formed transition metal-metal semiconductor alloy cap portion 27. During this annealing, the source-side metal semiconductor alloy portion 24s and the drain-side metal semiconductor alloy portion 24d are thinned.

The anneal used to provide the thickened source-side transition metal-metal semiconductor alloy portion 26s', the thickened drain-side transition metal-metal semiconductor alloy portion 26d', and optionally the thickened transition metal-metal semiconductor alloy cap 27' can be performed at a temperature from 300° C. to 500° C. The anneal used to provide the thickened source-side transition metal-metal semiconductor alloy portion 26s', the thickened drain-side transition metal-metal semiconductor alloy portion 26d', and optionally the thickened transition metal-metal semiconductor alloy cap 27' can be performed in an inert ambient such as, for example, helium, argon, neon and/or nitrogen. The anneal used to provide the thickened source-side transition metal-metal semiconductor alloy portion 26s', the thickened drain-side transition metal-metal semiconductor alloy portion 26d', and optionally the thickened transition metal-metal semiconductor alloy cap 27' can be performed utilizing one of the anneal processes mentioned above in forming the metal semiconductor alloy portions.

Figure 7:
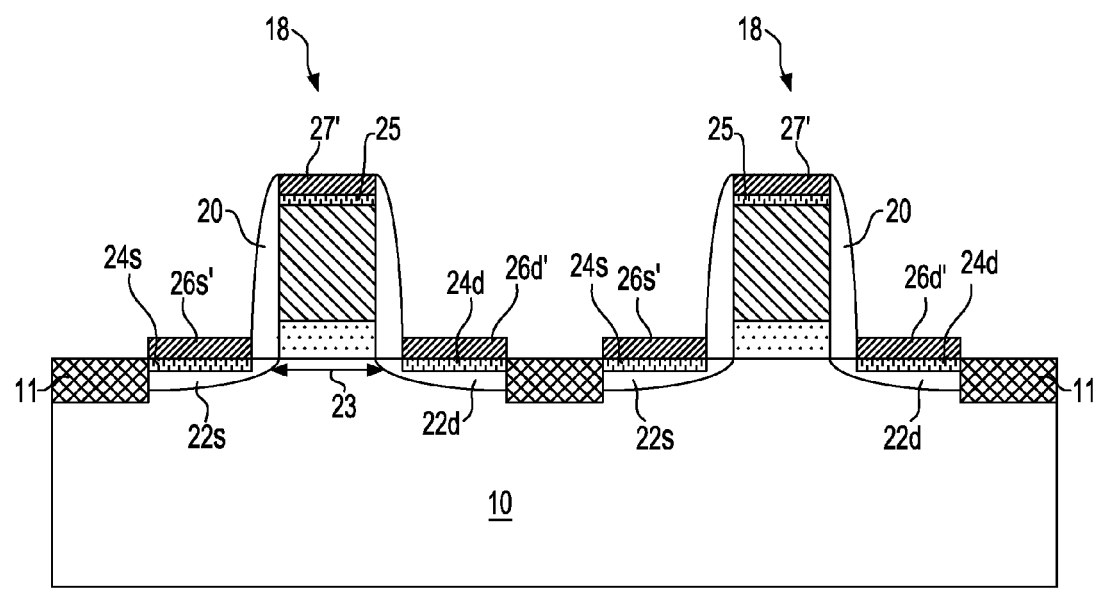
FIG. 7 is a cross sectional view of the first exemplary semiconductor structure of FIG. 6 after removing remaining portions of the transition metal.

Referring now FIG. 7, there is illustrated the first exemplary semiconductor structure of FIG. 6 after removing remaining portions of the transition metal 26. The remaining portions of the transition metal 26 can be removed utilizing a selective etching process. As used herein, the term "selective" in reference to a material removal process denotes that the rate of material removal for a first material is greater than the rate of removal for at least another material of the structure to which the material removal process is being applied. In one embodiment, the selectivity may be greater than 10:1. In another embodiment, the selectivity may be greater than 100:1. An example of a selective etch that can be used to remove remaining portions of transition metal 26 comprises sulfuric acid and peroxide mixture OR aqua regia (HNO$_3$, HCl, and water).

FIG. 7 illustrates one semiconductor structure of the present application. As shown, the semiconductor substrate includes a semiconductor substrate 10 having a source region 22s and a drain region 22d located within a semiconductor material portion of the semiconductor substrate 10, wherein the source region 22s and the drain region 22d are spaced apart by a channel region 23. The semiconductor structure also includes a functional gate structure 18 located above the channel region 15, a source-side material stack of, from bottom to top, a source-side metal semiconductor alloy portion 24s and a source-side transition metal-metal semiconductor alloy portion 26s or 26s' located on one side of the functional gate structure 18 and located atop the source region 22s, and a drain-side material stack of, from bottom to top, a drain-side metal semiconductor alloy portion 24d and a drain-side transition metal-metal semiconductor alloy portion 26d or 26d' located on another side of the functional gate structure 18 and located atop the drain region 22d.

Figure 8:
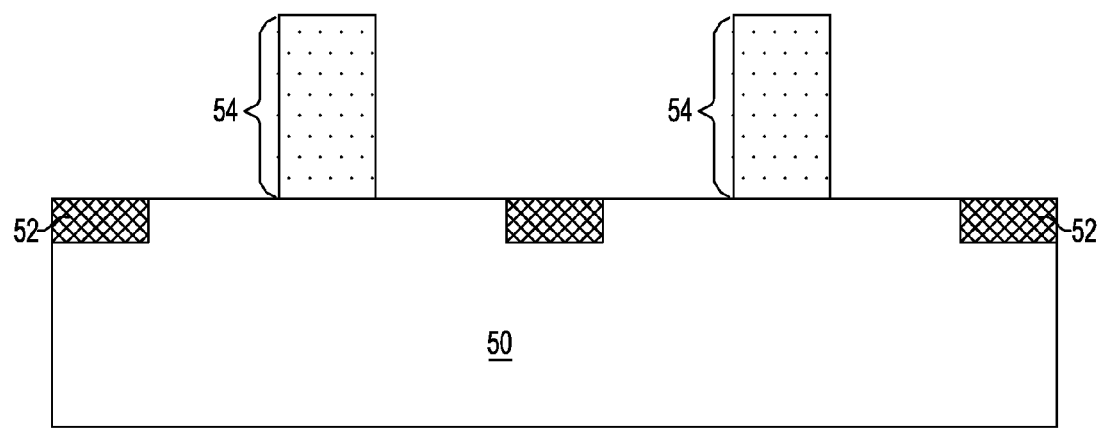
FIG. 8 is a cross sectional view of a second exemplary semiconductor structure including at least one sacrificial gate structure formed on an upper surface of a semiconductor substrate in accordance with another embodiment of the present application.

Referring now to FIG. 8, there is illustrated a second exemplary semiconductor structure including at least one sacrificial gate structure 54 formed on an upper surface of a semiconductor substrate 50 in accordance with another embodiment of the present application.

The semiconductor substrate 50 used in providing the second exemplary semiconductor structure shown in FIG. 8 is the same as semiconductor substrate 10 used in providing the first exemplary semiconductor structure shown in FIG. 1. Semiconductor substrate 50 may also be processed to include an isolation region 52. Isolation region 52 can be formed and include materials as described above in forming isolation regions 11 within semiconductor substrate 10.

The at least one sacrificial gate structure 54 is formed on an upper surface of semiconductor substrate 50. The term "sacrificial gate structure" is used throughout the present application to denote a material that serves as a placeholder structure for a functional gate structure to be subsequently formed.

The at least one sacrificial gate structure 54 can be formed by first providing a blanket layer of a sacrificial gate material on an upper surface of the semiconductor substrate 50. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the at least one sacrificial gate structure 54.

Figure 9:
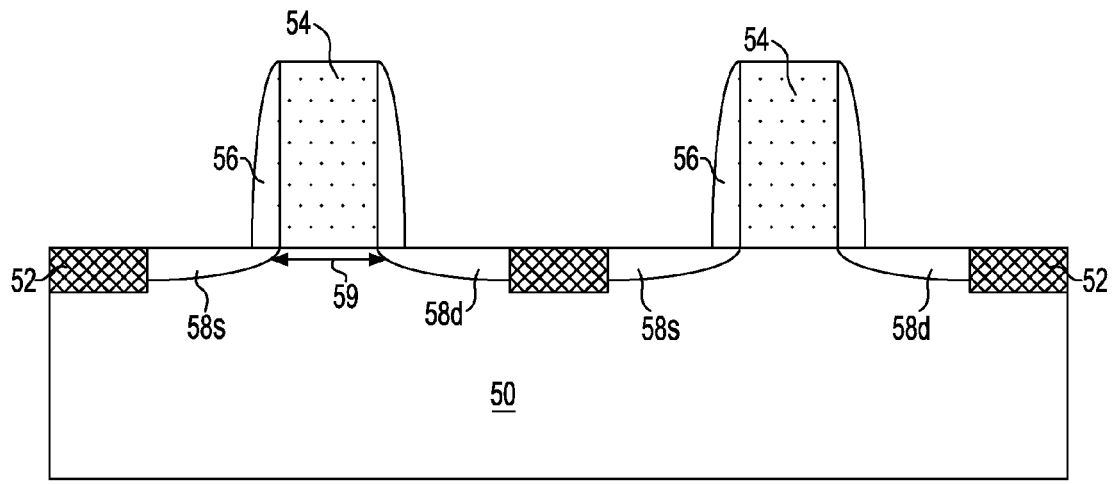
FIG. 9 is a cross sectional view of the second exemplary semiconductor structure of FIG. 8 after forming a spacer on each vertical sidewall of the at least one sacrificial gate structure and forming a source region on one side of the at least one sacrificial gate structure and a drain region on another side of the at least one sacrificial gate structure.

Referring now to FIG. 9, there is illustrated the second exemplary semiconductor structure of FIG. 8 after forming a spacer 56 on each vertical sidewall of the at least one sacrificial gate structure 54 and forming a source region 58s on one side of the at least one sacrificial gate structure 54 and a drain region 58d on another side of the at least one sacrificial gate structure 54. The semiconductor portion of the semiconductor substrate 50 that is positioned between the source region 58s and the drain region 58d is referred as a channel region 59.

The spacer 56 comprises one of the spacer materials mentioned above in forming spacer 22 to the first exemplary semiconductor structure. Spacer 56 can also be formed utilizing the technique mentioned above in forming spacer 22. The source region 58s and the drain region 58d can be formed by ion implantation as was also mentioned above in forming the source region 24s and the drain region 24d in the first exemplary semiconductor structure.

Figure 10:
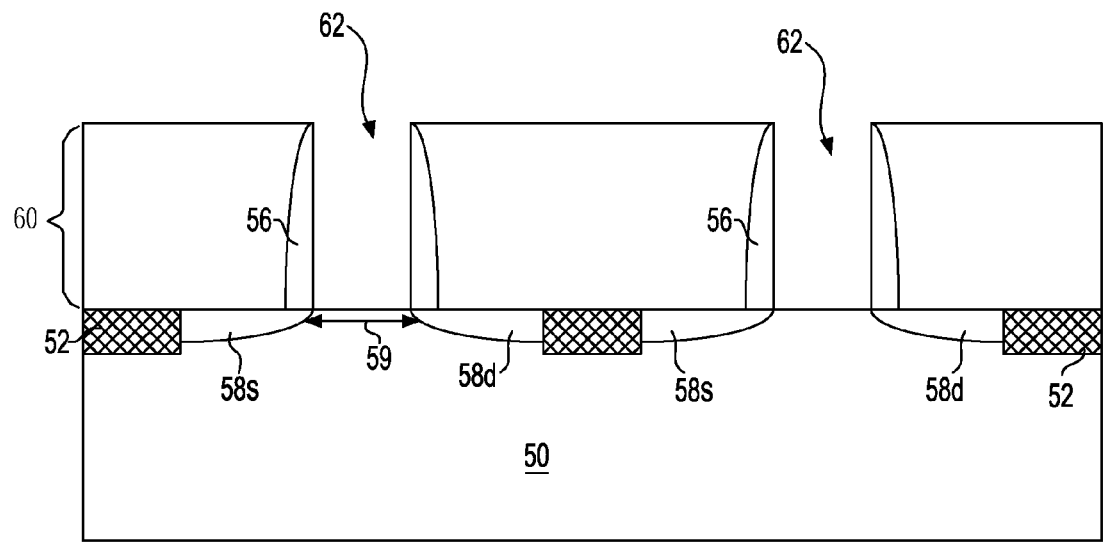
FIG. 10 is a cross sectional view of the second exemplary semiconductor structure of FIG. 9 after forming a dielectric material and thereafter forming a gate cavity by removing the at least one sacrificial gate structure.

Referring now to FIG. 10, there is illustrated the second exemplary semiconductor structure of FIG. 9 after forming a dielectric material 60 and thereafter forming a gate cavity 62 by removing the at least one sacrificial gate structure 54. Dielectric material 60 has an upper surface that is coplanar with an upper surface of the at least one gate structure 54. As such, the upper surface of the at least one gate structure 54 is exposed after forming the dielectric material 60.

In some embodiments, the dielectric material 60 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 60. The use of a self-planarizing dielectric material as dielectric material 60 may avoid the need to perform a subsequent planarizing step.

In one embodiment, the dielectric material 60 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 60, a planarization process or an etch back process follows the deposition of the dielectric material. The thickness of the dielectric material 60 that can be employed in the present application may vary depending on the type of dielectric material employed as well as the method that was employed in forming the same. In one embodiment, the dielectric material 60 has a thickness from 80 nm to 500 nm. Other thicknesses that are greater or lesser than the range provided above can also be used for the dielectric material 60.

Each gate cavity 62 can be formed by removing each of the sacrificial gate material structures 54 from the structure. Each sacrificial gate material structure 54 can be removed by etching. In one example, a reactive ion etch can be used to removal each sacrificial gate material structure 54.

Figure 11:
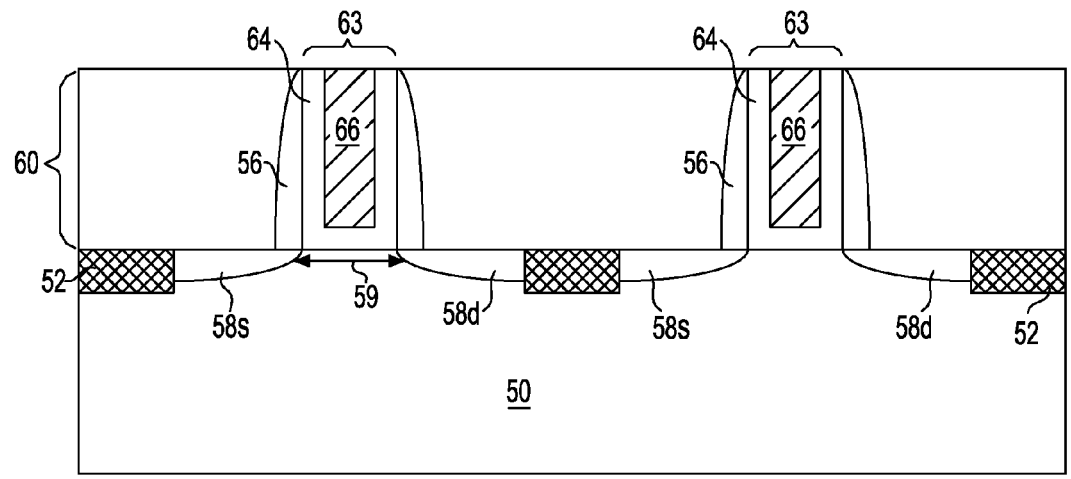
FIG. 11 is a cross sectional view of the second exemplary semiconductor structure of FIG. 10 after forming a gate dielectric portion and a gate conductor portion within the gate cavity.

Referring now to FIG. 11, there is illustrated the second exemplary semiconductor structure of FIG. 10 after forming a gate dielectric portion 64 and a gate conductor portion 66 within the gate cavity 62. The gate dielectric portion 64 and the gate conductor portion 66 provide a functional gate structure 63 within the area previously occupied by the sacrificial gate structure 54.

In some embodiments and as shown in the drawing, the gate dielectric portion 64 is U-shaped having a bottommost portion in direct contact with an upper surface of the semiconductor substrate 50 and vertical portions that are located on exposed sidewalls of each spacer 56. Within each gate cavity 62, the gate dielectric portion 64 surrounds the gate conductor portion 64. In another embodiment, the gate dielectric portion 64 is not U-shaped and thus lacks the vertical portions mentioned. In such an embodiment, the gate conductor portion 66 that is formed atop the non-U-shaped gate dielectric fills the remaining portion of the gate cavity and has outermost edges that directly contact a sidewall surface of each spacer 56.

The gate dielectric portion 64 may comprise one of the gate dielectric materials mentioned above for gate dielectric material 14. Also, the gate dielectric portion 64 may be formed utilizing one of the deposition techniques or thermal growth techniques mentioned above in forming gate dielectric 14. The thickness of gate dielectric portion 64 is also with the range mentioned above for gate dielectric material 14.

The gate conductor portion 66 may comprise one of the metal gate conductor materials mentioned above for gate conductor 16. Also, the gate dielectric portion 66 may be formed utilizing one of the deposition techniques mentioned above in forming gate conductor 16. The thickness of gate dielectric portion 66 is also with the range mentioned above for gate conductor 16.

Figure 12:
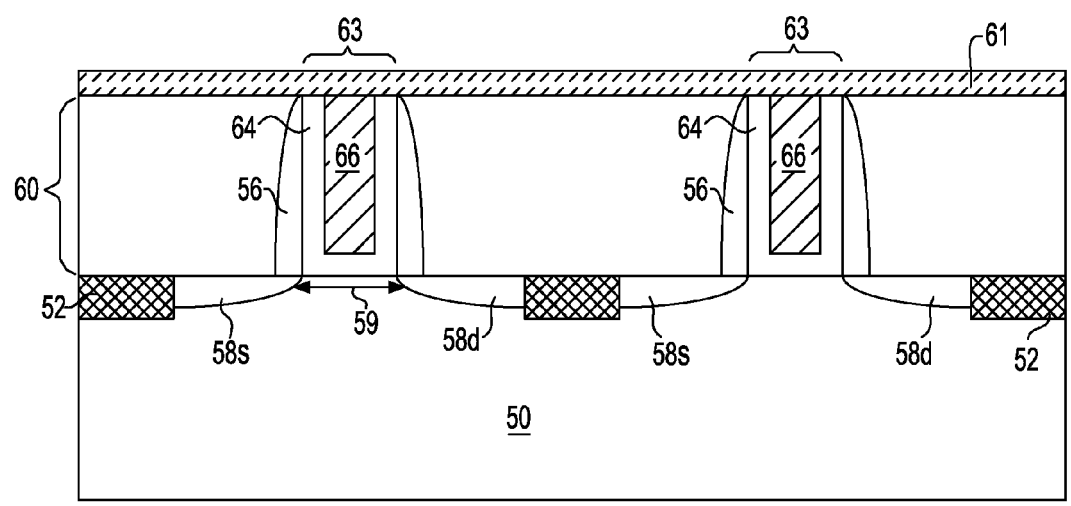
FIG. 12 is a cross sectional view of the second exemplary semiconductor structure of FIG. 11 after forming a dielectric cap material on an upper surface of the dielectric material.

Referring now to FIG. 12, there is illustrated the second exemplary semiconductor structure of FIG. 11 after forming a dielectric cap material 61 on an upper surface of the dielectric material 60. The dielectric cap material 61 includes an insulator material that differs from the dielectric material 60. Examples of insulator materials that can be used as the dielectric cap material 61 include, for example, silicon dioxide, silicon nitride and silicon oxynitride. The dielectric cap material 61 can be formed by a deposition process including, for example, chemical vapor deposition, plasma enhanced chemical vapor deposition, evaporation and spin-on coating. The dielectric cap material 61 has a thickness from 1 nm to 20 nm. Other thicknesses can also be used for the thickness of the dielectric cap material 61.

Figure 13:
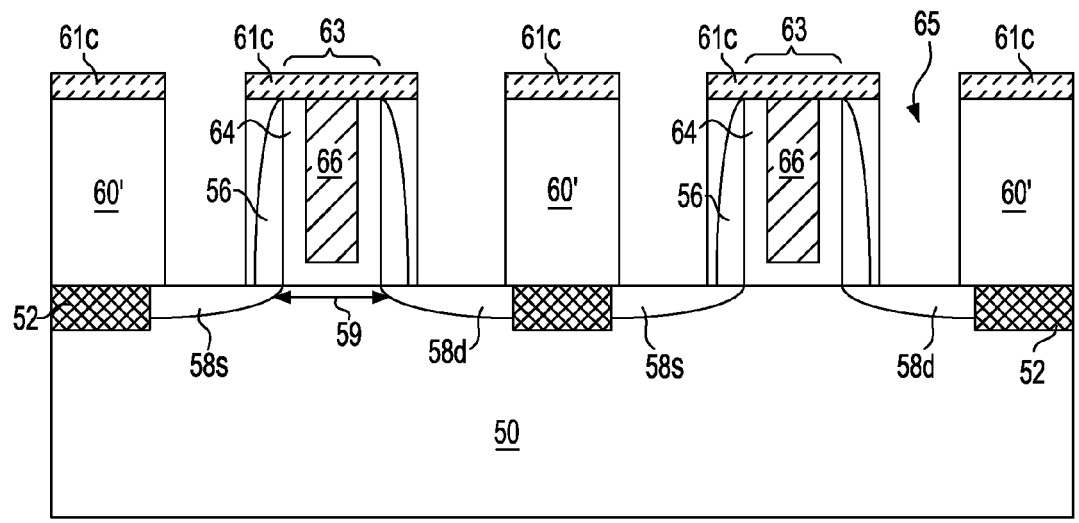
FIG. 13 is a cross sectional view of the second exemplary semiconductor structure of FIG. 12 after forming a plurality of openings through the dielectric cap material and the dielectric material exposing the source region and the drain region.

Referring now to FIG. 13, there is illustrated the second exemplary semiconductor structure of FIG. 12 after forming a plurality of openings 65 through the dielectric cap material 61 and the dielectric material 60 exposing the source region 58s and the drain region 58d. Each remaining portion of the dielectric cap material 60 is referred to herein as dielectric cap material portion 61c, while each remaining portion of the dielectric material 60 can be referred to herein as dielectric material portion 60'. The plurality of openings can be formed by lithography and etching. One or more etching processes can be used in forming the plurality of openings 65. The remaining portion of the dielectric cap portion 61c is present on a topmost surface of each functional gate structure 63. As is shown in the drawings of the present application, the dielectric cap portion 61c that is located on the topmost surface of each functional gate structure 63 extends beyond the vertical edges of the functional gate structure 63 and beyond an outermost edge of each spacer 56. Also, a portion of each dielectric cap portion 61c that is present on the topmost surface of the functional gate structure 63 is present on a dielectric material portion 60' that remains adjacent to the spacer 56. Further, the dielectric cap portion 61c and the dielectric material portion 60' that is present above the isolation regions 52 extend beyond the outer most edges of the isolation regions 52.

Figure 14:
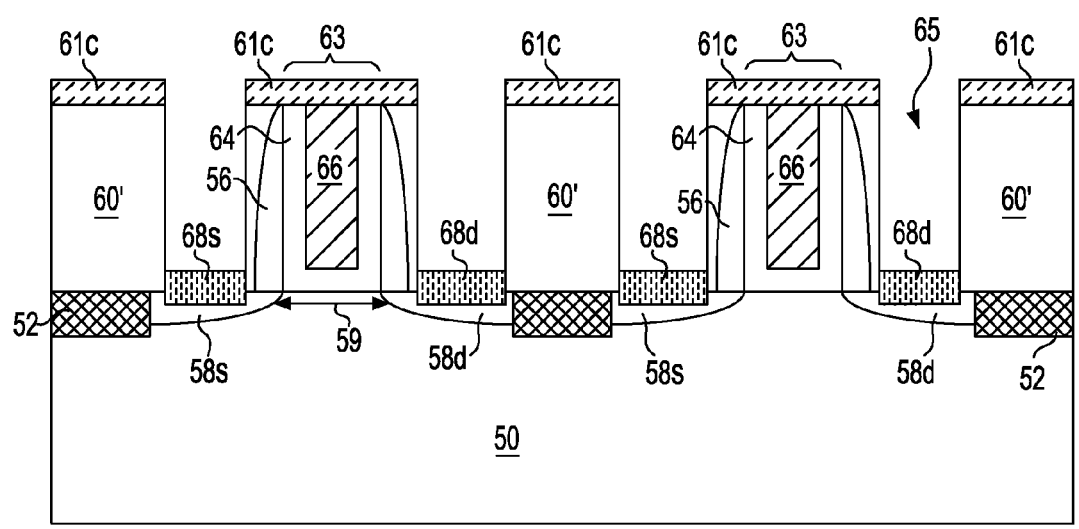
FIG. 14 is a cross sectional view of the second exemplary semiconductor structure of FIG. 13 after forming a source-side metal semiconductor alloy portion on the source region and a drain-side metal semiconductor alloy portion on the drain region.

Referring now to FIG. 14, there is illustrated the second exemplary semiconductor structure of FIG. 13 after forming a source-side metal semiconductor alloy portion 68s on the source region 58s and a drain-side metal semiconductor alloy portion 68d on the drain region 58d. In this embodiment, no metal semiconductor alloy cap portion is formed atop the gate conductor portion 66.

The source-side metal semiconductor alloy portion 68s and the drain-side metal semiconductor alloy portion 68d can include one of the metal semiconductor alloys mentioned above for source-side metal semiconductor alloy portion 24s and drain-side metal semiconductor alloy portion 24d. Further, the source-side metal semiconductor alloy portion 68s and the drain-side metal semiconductor alloy portion 68d can be formed utilizing the processing steps mentioned above in forming source-side metal semiconductor alloy portion 24s and drain-side metal semiconductor alloy portion 24d.

Figure 15:
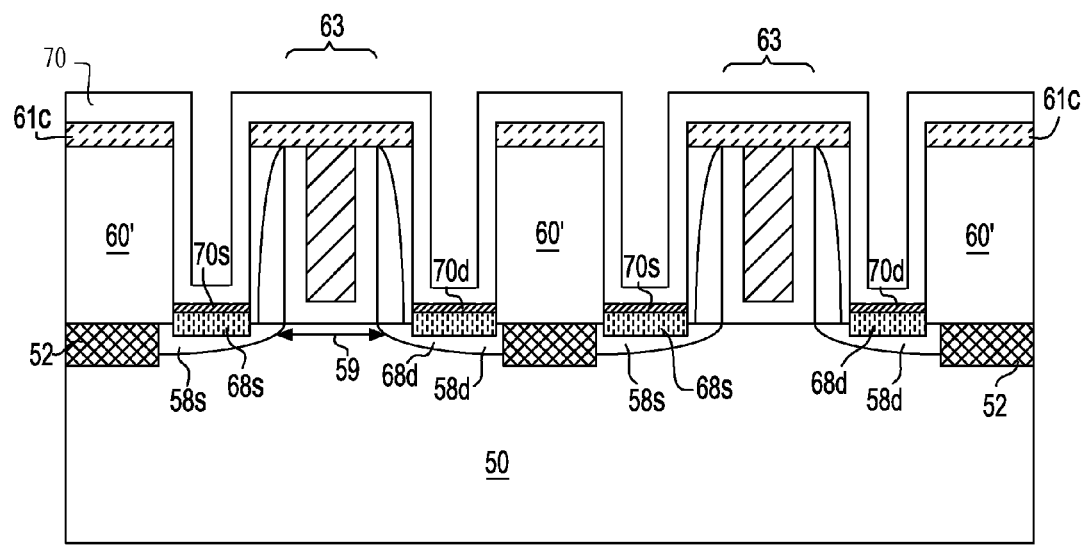
FIG. 15 is a cross sectional view of the second exemplary semiconductor structure of FIG. 14 after deposition of a transition metal in which a source-side transition metal-metal semiconductor alloy portion forms preferably in-situ on the source-side metal semiconductor alloy portion and a drain-side transition metal-metal semiconductor alloy portion forms preferably in-situ on the drain-side metal semiconductor alloy portion.

Referring now to FIG. 15, there is illustrated the second exemplary semiconductor structure of FIG. 14 after deposition of a transition metal 70 in which a source-side transition metal-metal semiconductor alloy portion 70s forms preferably in-situ on the source-side metal semiconductor alloy portion 68s and a drain-side transition metal-metal semiconductor alloy portion 70d forms preferably in-situ on the drain-side metal semiconductor alloy portion 68d.

The transition metal 70, source-side transition metal-metal semiconductor alloy portion 70s and drain-side transition metal-metal semiconductor alloy portion 70d are formed as described above in forming transition metal 26, source-side transition metal-metal semiconductor alloy portion 26s and drain-side transition metal-metal semiconductor alloy portion 26d. Also, the transition metal 70, source-side transition metal-metal semiconductor alloy portion 70s and drain-side transition metal-metal semiconductor alloy portion 70d can include one of the transition metal mentioned above in the transition metal 26, source-side transition metal-metal semiconductor alloy portion 26s and drain-side transition metal-metal semiconductor alloy portion 26d. In this embodiment of the present application, portions of the transition material 26 are present on the vertical sidewalls of each dielectric material portion 60' and each dielectric cap material portion 61c. Also, a portion of the transition metal 26 extends onto an upper surface of each dielectric cap material portion 61c.

Figure 16:
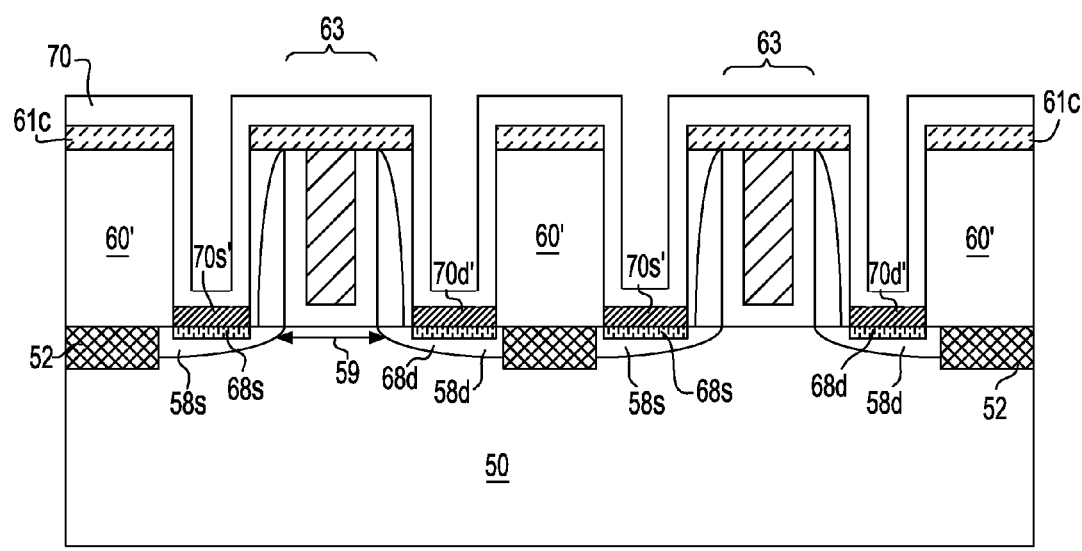
FIG. 16 is a cross sectional view of the second exemplary semiconductor structure of FIG. 15 after annealing.

Referring now to FIG. 16, there is illustrated the second exemplary semiconductor structure of FIG. 15 after annealing. This anneal is optional and thus not be employed in all instances. The anneal step forms a thickened source-side transition metal-metal semiconductor alloy portion 70s' and a thickened drain-side transition metal-metal semiconductor alloy portion 70d'. The anneal used in this embodiment of the present application is the same as that described above in forming the first exemplary semiconductor structure shown in FIG. 6.

Figure 17:
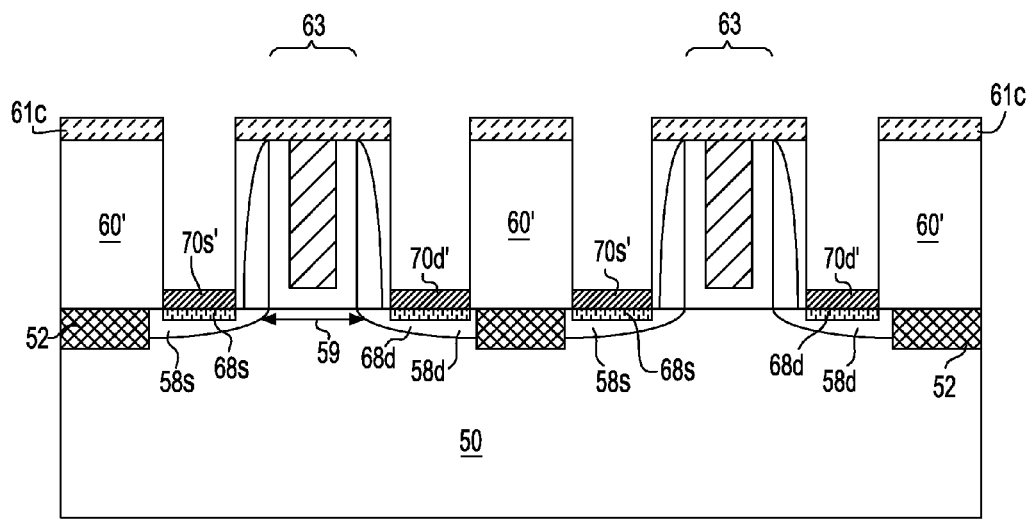
FIG. 17 is a cross sectional view of the second exemplary semiconductor structure of FIG. 16 after removing remaining portions of the transition metal.

Referring now to FIG. 17, there is illustrated the second exemplary semiconductor structure of FIG. 16 after removing remaining portions of the transition metal 70. The remaining portions of the transition metal 70 can be removed utilizing a selective etching process such as described above for removing remaining portions of transition metal 26 from the first exemplary semiconductor structure.

FIG. 17 illustrates another semiconductor structure of the present application. As shown the semiconductor substrate includes a semiconductor substrate 50 having a source region 58s and a drain region 58d located within a semiconductor material portion of the semiconductor substrate 50, wherein the source region 58s and the drain region 58d are spaced apart by a channel region 59. The semiconductor structure also includes a functional gate structure 63 located above the channel region 59, a source-side material stack of, from bottom to top, a source-side metal semiconductor alloy portion 68s and a source-side transition metal-metal semiconductor alloy portion 70s or 70s' located on one side of the functional gate structure 63 and located atop the source region 58s, and a drain-side material stack of, from bottom to top, a drain-side metal semiconductor alloy portion 68d and a drain-side transition metal-metal semiconductor alloy portion 70d or 70d' located on another side of the functional gate structure 63 and located atop the drain region 58d.

A conductive material (not shown) can then be deposited filling each opening. The conductive material that is deposited may include for example, at least one of copper, tungsten, and aluminum. In one embodiment, the conductive material that fills each opening comprises copper or a copper alloy such as, for example, a copper-aluminum alloy. The conductive material may be formed by a deposition process including chemical vapor deposition (CVD), plasma enhanced chemical vapor deposition (PECVD), sputtering, or chemical solution deposition. Alternatively, a plating process that fills each contact opening from the bottom upwards can be used. After depositing the conductive material, a planarization process such as, for example, chemical mechanical polishing (CMP) and/or grinding, can be employed to remove portions of the conductive material that extends above the mouth of each opening. In some embodiments, the planarization step can stop on an upper surface of each dielectric cap portion 51c. In another embodiment, the planarization step can remove each dielectric cap portion 51c from the structure.

Figure 18:
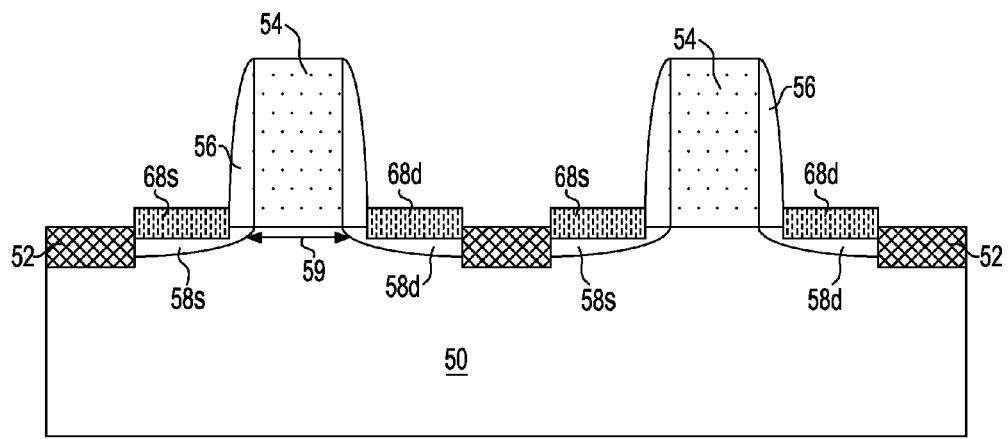
FIG. 18 is a cross sectional view of the second exemplary semiconductor structure of FIG. 9 after forming a source-side metal semiconductor alloy portion on the source region and a drain-side metal semiconductor alloy portion on the drain region in accordance with an alternative embodiment of the present application.

Referring to FIG. 18, there is illustrated the second exemplary semiconductor structure of FIG. 9 after forming a source-side metal semiconductor alloy portion 68s on the source region 58s and the drain-side metal semiconductor alloy portion 68d of the drain region 58d in accordance with an alternative embodiment of the present application. In this embodiment, no metal semiconductor alloy cap portion is formed atop the gate conductor portion 66.

The source-side metal semiconductor alloy portion 68s and the drain-side metal semiconductor alloy portion 68d can include one of the metal semiconductor alloys mentioned above for source-side metal semiconductor alloy portion 24s and drain-side metal semiconductor alloy portion 24d. Further, the source-side metal semiconductor alloy portion 68s and the drain-side metal semiconductor alloy portion 68d can be formed utilizing the processing steps mentioned above in forming source-side metal semiconductor alloy portion 24s and drain-side metal semiconductor alloy portion 24d.

Figure 19:
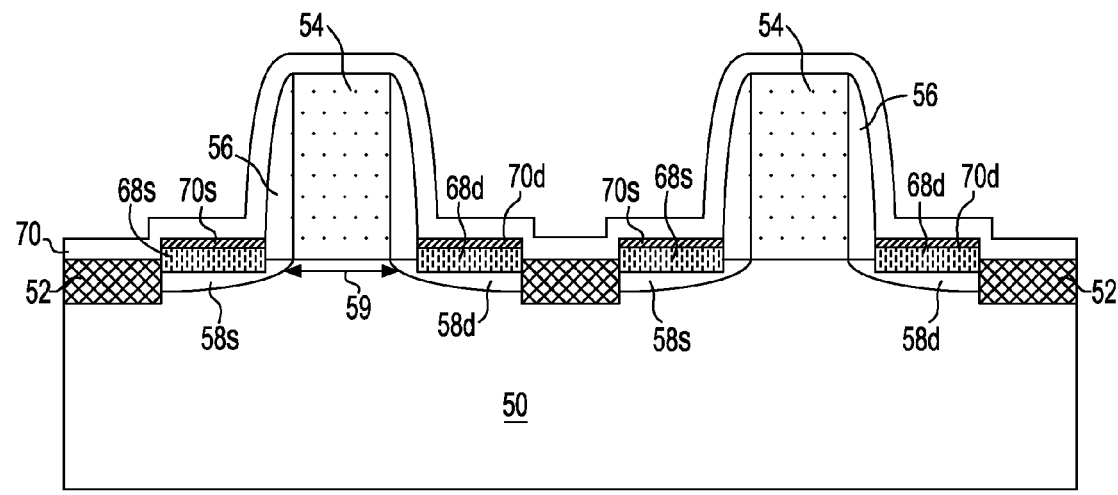
FIG. 19 is a cross sectional view of the second exemplary semiconductor structure of FIG. 18 after deposition of a transition metal in which a source-side transition metal-metal semiconductor alloy portion forms preferably in-situ on the source-side metal semiconductor alloy portion and a drain-side transition metal-metal semiconductor alloy portion forms preferably in-situ on the drain-side metal semiconductor alloy portion.

Referring now to FIG. 19, there is illustrated the second exemplary semiconductor structure of FIG. 18 after deposition of a transition metal 70 in which a source-side transition metal-metal semiconductor alloy portion 70s forms preferably in-situ on the source-side metal semiconductor alloy portion 68s and a drain-side transition metal-metal semiconductor alloy portion 70d forms preferably in-situ on the drain-side metal semiconductor alloy portion 68d.

The transition metal 70, source-side transition metal-metal semiconductor alloy portion 70s and drain-side transition metal-metal semiconductor alloy portion 70d are formed as described above in forming transition metal 26, source-side transition metal-metal semiconductor alloy portion 26s and drain-side transition metal-metal semiconductor alloy portion 26d. Also, the transition metal 70, source-side transition metal-metal semiconductor alloy portion 70s and drain-side transition metal-metal semiconductor alloy portion 70d can include one of the transition metal mentioned above in the transition metal 26, source-side transition metal-metal semiconductor alloy portion 26s and drain-side transition metal-metal semiconductor alloy portion 26d. The source-side transition metal-metal semiconductor alloy portion 70s and drain-side transition metal-metal semiconductor alloy portion 70d each contain up to 70% of transition metal.

Figure 20:
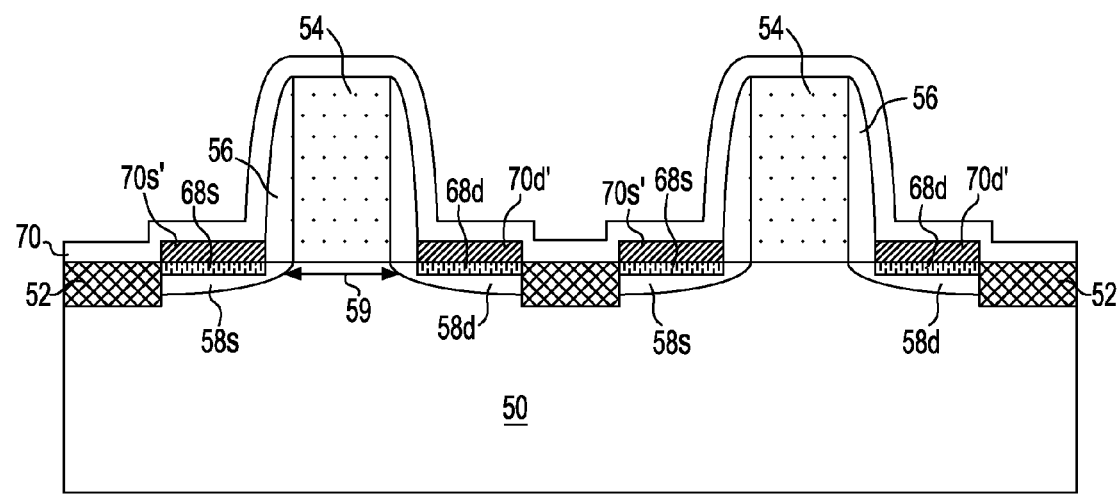
FIG. 20 is a cross sectional view of the second exemplary semiconductor structure of FIG. 19 after annealing.

Referring now to FIG. 20, there is illustrated the second exemplary semiconductor structure of FIG. 19 after annealing. This anneal is optional and thus not need be performed in all instances. The anneal step forms a thickened source-side transition metal-metal semiconductor alloy portion 70s' and a thickened drain-side transition metal-metal semiconductor alloy portion 70d'. The anneal used in this embodiment of the present application is the same as that described above in forming the first exemplary semiconductor structure shown in FIG. 6.

Figure 21:
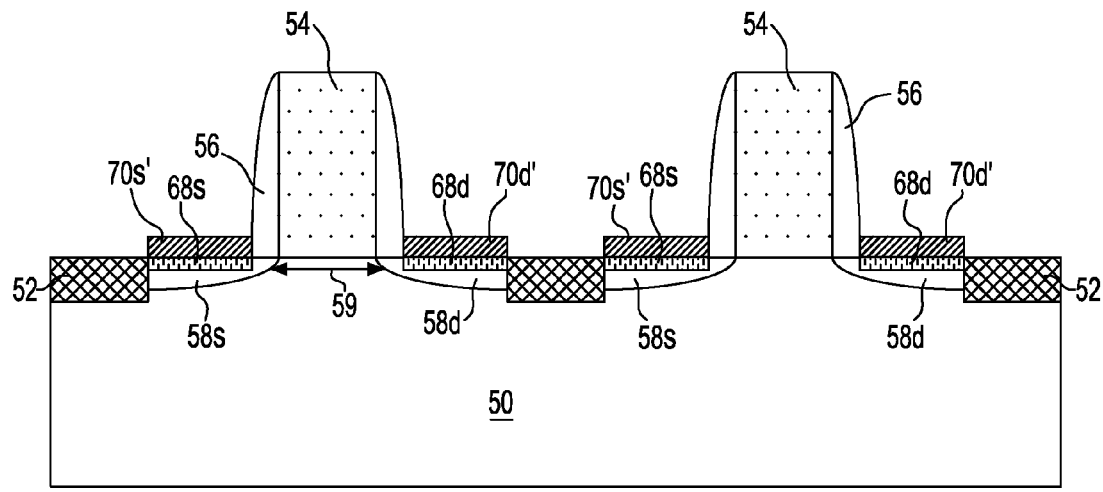
FIG. 21 is a cross sectional view of the second exemplary semiconductor structure of FIG. 20 after removing remaining portions of the transition metal.

Referring now to FIG. 21, there is illustrated the second exemplary semiconductor structure of FIG. 20 after removing remaining portions of the transition metal 70. The remaining portions of the transition metal 70 can be removed utilizing a selective etching process such as described above for removing remaining portions of transition metal 26 from the first exemplary semiconductor structure.

Figure 22:
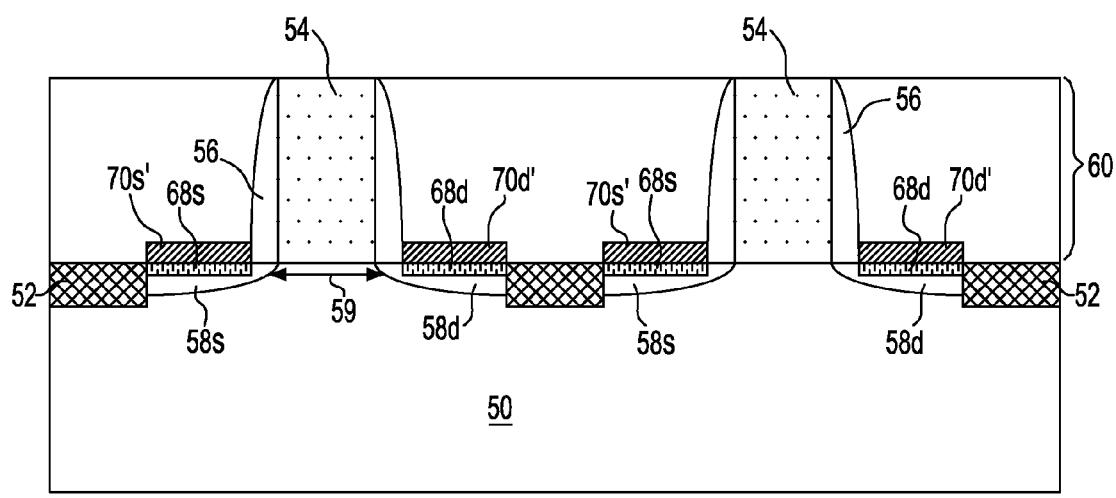
FIG. 22 is a cross sectional view of the second exemplary semiconductor structure of FIG. 21 after forming a dielectric material.
Figure 23:
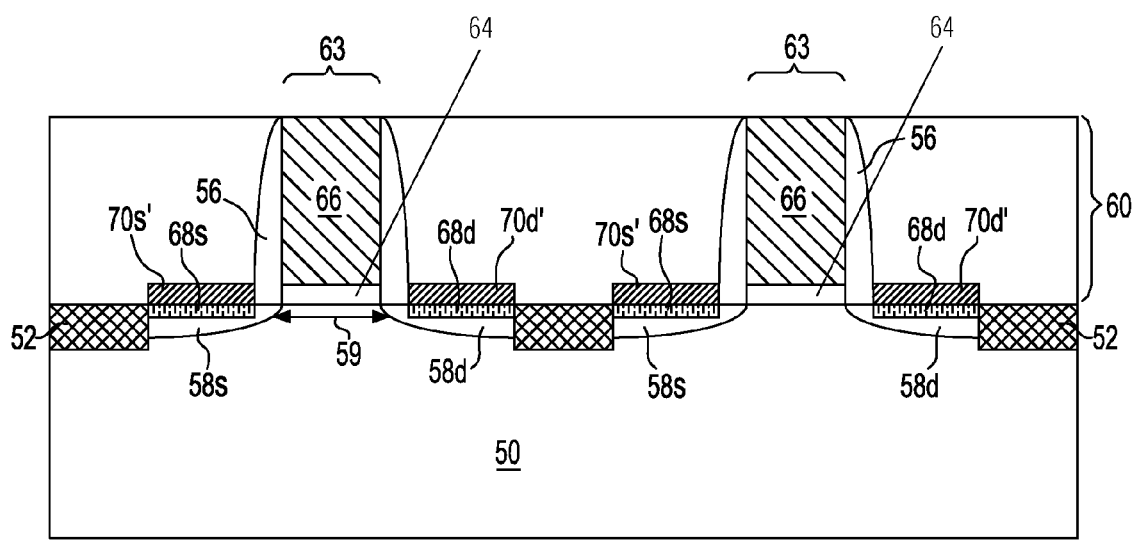
FIG. 23 is a cross sectional view of the second exemplary semiconductor structure of FIG. 22 after forming a gate cavity by removing the at least one sacrificial gate structure, and forming a gate dielectric portion and a gate conductor portion within the gate cavity.

Referring now to FIG. 22, there is illustrated the second exemplary semiconductor structure of FIG. 21 after forming a dielectric material 60. The dielectric material 60 that can be employed in this alternative embodiment of the present application includes one of the dielectric materials mentioned above for dielectric material 60. Also, the dielectric material 60 that can be employed in this alternative embodiment of the present application formed utilizing one of the techniques mentioned above for forming dielectric material 60.

Referring now to FIG. 22, there is illustrated the second exemplary semiconductor structure of FIG. 21 after forming a gate cavity by removing the at least one sacrificial gate structure 54, and forming a functional gate structure including a gate dielectric portion 64 and a gate conductor portion 66 within the gate cavity.

Each gate cavity can be formed utilizing the technique mentioned above in forming the gate cavity in the second exemplary structure of FIG. 10. Also, the description concerning the gate dielectric portion 64 and gate conductor portion 66 used in providing the second exemplary structure shown in FIG. 11 can also be used in providing the gate dielectric portion 64 and gate conductor portion 66 within the gate cavity. In this embodiment, the gate dielectric portion 64 is not U-shaped. Elements 64 and 66 collectively made by referred to as a functional gate structure 63.

FIG. 22 illustrates another semiconductor structure of the present application. As shown, the semiconductor substrate includes a semiconductor substrate 50 having a source region 58s and a drain region 58d located within a semiconductor material portion of the semiconductor substrate 50, wherein the source region 58s and the drain region 58d are spaced apart by a channel region 59. The semiconductor structure also includes a functional gate structure 63 located above the channel region 59, a source-side material stack of, from bottom to top, a source-side metal semiconductor alloy portion 68s and a source-side transition metal-metal semiconductor alloy portion 70s or 70s' located on one side of the functional gate structure 63 and located atop the source region 58s, and a drain-side material stack of, from bottom to top, a drain-side metal semiconductor alloy portion 68d and a drain-side transition metal-metal semiconductor alloy portion 70d or 70d' located on another side of the functional gate structure 18 and located atop the drain region 58d.

The method of the present application for forming the source-side material stack on a source region and the drain-side material stack on a drain region is not limited to the specific examples mentioned above. Instead, the method of the present application for forming the source-side material stack on a source region and the drain-side material stack on a drain region can be used in any other processing schemes including, for example, formation of FinFET and semiconductor nanowire devices. In addition, the method of the present application can be used in forming contacts to any other type of semiconductor device such as, for example, a hetero-bipolar junction transistor (HBT). Also, the deposition of the transition metal onto a metallic surface of a gate conductor portion may cause some of the transition metal to diffuse into the metallic surface of the gate conductor portion.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
providing a source region and a drain region at a footprint of a functional gate structure;
forming a source-side metal semiconductor alloy portion on said source region, and a drain-side metal semiconductor alloy portion on said drain region;
depositing a transition metal on at least said source-side metal semiconductor alloy portion and said drain-side metal semiconductor alloy portion, wherein during said depositing said transition metal reacts in-situ with said source-side metal semiconductor alloy portion forming a source-side transition metal-metal semiconductor alloy portion on a surface of said source-side metal semiconductor alloy portion, and said transition metal reacts in-situ with said drain-side metal semiconductor alloy portion forming a drain-side transition metal-metal semiconductor alloy portion on a surface of said drain-side metal semiconductor alloy portion; and removing remaining portions of said transition metal.

2. The method of claim 1, wherein prior to removing said remaining portions of said transition metal, an anneal step is performed to thicken both the source-side transition metal-metal semiconductor alloy portion and said drain-side transition metal semiconductor alloy portion.

3. The method of claim 1, wherein outermost edges of said source-side metal semiconductor alloy portion and outermost edges of said source-side transition metal-metal semiconductor alloy portion are vertically coincident to each other, and wherein outermost edges of said drain-side metal semiconductor alloy portion and outermost edges of said drain-side transition metal-metal semiconductor alloy portion are vertically coincident to each other.

4. The method of claim 1, wherein said transition metal comprises a different metal than said metal of said source-side metal semiconductor alloy portion and of said drain-side metal semiconductor alloy portion.

5. The method of claim 1, wherein said semiconductor substrate comprises silicon, said source-side metal semiconductor alloy portion comprises nickel silicide, said drain-side metal semiconductor alloy portion comprises nickel silicide and said transition metal comprises titanium.

6. The method of claim 1, wherein said depositing said transition metal is performed by sputtering at a temperature from room temperature up to, and including 500° C.

7. A method of forming a semiconductor substrate comprising:

providing a source region and a drain region at a footprint of a sacrificial gate structure;

forming a source-side metal semiconductor alloy portion on said source region, and a drain-side metal semiconductor alloy portion on said drain region;

depositing a transition metal on at least said source-side metal semiconductor alloy portion and said drain-side metal semiconductor alloy portion, wherein during said depositing said transition metal reacts in-situ with said source-side metal semiconductor alloy portion forming a source-side transition metal-metal semiconductor alloy portion on a surface of said source-side metal semiconductor alloy portion, and said transition metal reacts in-situ with said drain-side metal semiconductor alloy portion forming a drain-side transition metal-metal semiconductor alloy portion on a surface of said drain-side metal semiconductor alloy portion; and removing remaining portions of said transition metal, wherein said sacrificial gate structure is replaced with a functional gate structure prior to forming the source-side metal semiconductor alloy portion on the source region, and the drain-side metal semiconductor alloy portion on the drain region, or after removing the transition metal.

8. The method of claim 7, wherein prior to removing said remaining portions of said transition metal, an anneal step is performed to thicken both the source-side transition metal-metal semiconductor alloy portion and said drain-side transition metal semiconductor alloy portion.

9. The method of claim 7, wherein outermost edges of said source-side metal semiconductor alloy portion and outermost edges of said source-side transition metal-metal semiconductor alloy portion are vertically coincident to each other, and wherein outermost edges of said drain-side metal semiconductor alloy portion and outermost edges of said drain-side transition metal-metal semiconductor alloy portion are vertically coincident to each other.

10. The method of claim 7, wherein said transition metal comprises a different metal than said metal of said source-side metal semiconductor alloy portion and of said drain-side metal semiconductor alloy portion.

11. The method of claim 7, wherein said semiconductor substrate comprises silicon, said source-side metal semiconductor alloy portion comprises nickel silicide or platinum-nickel silicide, said drain-side metal semiconductor alloy portion comprises nickel silicide or platinum-nickel silicide, and said transition metal comprises titanium.

* * * * *